United States Patent
Zheng et al.

(10) Patent No.: US 8,912,096 B2
(45) Date of Patent: Dec. 16, 2014

(54) METHODS FOR PRECLEANING A SUBSTRATE PRIOR TO METAL SILICIDE FABRICATION PROCESS

(75) Inventors: Bo Zheng, Saratoga, CA (US); Arvind Sundarrajan, San Jose, CA (US); Manish Hamkar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 146 days.

(21) Appl. No.: 13/097,016

(22) Filed: Apr. 28, 2011

(65) Prior Publication Data

US 2012/0276740 A1  Nov. 1, 2012

(51) Int. Cl.
| | | |
|---|---|---|
| H01L 21/302 | (2006.01) | |
| H01L 21/461 | (2006.01) | |
| H01L 21/285 | (2006.01) | |
| H01L 21/02 | (2006.01) | |
| H01L 21/67 | (2006.01) | |

(52) U.S. Cl.
CPC ...... *H01L 21/28506* (2013.01); *H01L 21/0206* (2013.01); *H01L 21/02068* (2013.01); *H01L 21/28518* (2013.01); *H01L 21/67207* (2013.01)
USPC ............ 438/710; 438/682; 257/E21.296

(58) Field of Classification Search
USPC ................. 438/682, 710; 257/E21.296
See application file for complete search history.

(56) References Cited

U.S. PATENT DOCUMENTS

| | | |
|---|---|---|
| 6,207,487 B1 | 3/2001 | Kim et al. |
| 6,242,808 B1 | 6/2001 | Shimizu et al. |
| 6,251,242 B1 | 6/2001 | Fu et al. |
| 6,277,249 B1 | 8/2001 | Gopalraja et al. |
| 6,284,646 B1 | 9/2001 | Leem |
| 6,305,314 B1 | 10/2001 | Sneh et al. |
| 6,335,240 B1 | 1/2002 | Kim et al. |
| 6,344,419 B1 | 2/2002 | Forster et al. |
| 6,348,376 B2 | 2/2002 | Lim et al. |
| 6,358,829 B2 | 3/2002 | Yoon et al. |
| 6,372,598 B2 | 4/2002 | Kang et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,432,479 B2 * | 8/2002 | Chang et al. ........... 427/255.394 |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |

(Continued)

*Primary Examiner* — Thao X Le
*Assistant Examiner* — Eric Jones
(74) *Attorney, Agent, or Firm* — Patterson & Sheridan, LLP

(57) ABSTRACT

Methods for precleaning native oxides or other contaminants from a surface of a substrate prior to forming a metal silicide layer on the substrate. In one embodiment, a method for removing native oxides from a substrate includes transferring a substrate having an oxide layer disposed thereon into a processing chamber, performing a pretreatment process on the substrate by supplying a pretreatment gas mixture into the processing chamber, performing an oxide removal process on the substrate by supplying a cleaning gas mixture into the processing chamber, wherein the cleaning gas mixture includes at least an ammonium gas and a nitrogen trifluoride, and performing a post treatment process on the cleaned substrate by supplying a post treatment gas mixture into the processing chamber.

20 Claims, 4 Drawing Sheets

(56) References Cited

U.S. PATENT DOCUMENTS

| | | |
|---|---|---|
| 6,482,740 B2 | 11/2002 | Soininen et al. |
| 6,489,214 B2 | 12/2002 | Kim et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 7,005,372 B2 * | 2/2006 | Levy et al. .................... 438/627 |
| 7,691,749 B2 * | 4/2010 | Levy et al. .................... 438/680 |
| 2003/0059538 A1 | 3/2003 | Chung et al. |
| 2004/0058557 A1 * | 3/2004 | Eisele et al. .................. 438/769 |
| 2005/0230350 A1 * | 10/2005 | Kao et al. ......................... 216/67 |
| 2006/0051966 A1 * | 3/2006 | Or et al. ........................ 438/706 |
| 2006/0264043 A1 * | 11/2006 | Stewart et al. ................ 438/678 |
| 2006/0286776 A1 * | 12/2006 | Ranish et al. ................. 438/478 |
| 2007/0015360 A1 * | 1/2007 | Lu et al. ........................ 438/682 |
| 2007/0123051 A1 * | 5/2007 | Arghavani et al. ............ 438/715 |
| 2007/0209931 A1 | 9/2007 | Miller |
| 2007/0243327 A1 * | 10/2007 | Kang et al. ............... 427/255.29 |
| 2007/0243693 A1 * | 10/2007 | Nemani et al. ............... 438/424 |
| 2008/0160210 A1 * | 7/2008 | Yang et al. .................... 427/534 |
| 2008/0268645 A1 * | 10/2008 | Kao et al. ...................... 438/694 |
| 2009/0308840 A1 * | 12/2009 | Kohno et al. .................. 216/37 |
| 2009/0320755 A1 * | 12/2009 | Liu et al. ....................... 118/719 |
| 2010/0018460 A1 * | 1/2010 | Singh et al. ................... 118/620 |
| 2010/0200993 A1 * | 8/2010 | Cui et al. ...................... 257/767 |

* cited by examiner

METHODS FOR PRECLEANING A SUBSTRATE PRIOR TO METAL SILICIDE FABRICATION PROCESS

BACKGROUND OF THE INVENTION

1. Field of the Invention

Embodiments of the present invention generally relate to methods for forming semiconductor devices. More particularly, embodiments of the present invention generally relate to methods for pre-cleaning a substrate surface prior to forming a metal silicide on a semiconductor substrate.

2. Description of the Related Art

Metal gates or contacts typically include a doped silicon surface, one or more barrier layers, one or more liner layers and bulk metal to complete the gate structure. The cleanliness of the substrate surface between layers is critical for reducing contact resistance and hence, optimal device performance. For logic devices, the contact is usually a silicide, such as nickel silicide (NiSi), cobalt silicide ($CoSi_2$), or titanium silicide ($TiSi_2$). Nickel silicide is becoming more popular for smaller geometries, e.g., geometries having aspect ratios of about 10:1 or smaller, because NiSi is widely available and has a lower resistivity and lower contact resistance compared to other metal silicides.

In a typical fabrication process, a pre-clean process is performed before the metal silicide is formed on a substrate in one vacuum environment. Prior to the metal silicide fabrication process, the substrate may be transferred among different vacuum environment to perform a different processing step. As a result, the substrate can be subjected to oxidative conditions during the transfer, accumulating native oxides or contaminants on the substrate surface prior to the metal silicide fabrication process. Excess native oxide accumulation or contaminants may adversely affect the nucleation capability of the metal elements to adhere on the substrate surface to form the metal silicide layer. Poor nucleation of the metal elements on the interface may result in poor adhesion of the metal silicide layer to the silicon substrate surface, thereby resulting in peeling and particle flakes. Furthermore, poor adhesion at the interface may also result in undesired high contact resistance, thereby resulting in poor electrical properties of the device characteristics. In addition, poor nucleation of the metal elements adhered on the silicon substrate surface may further result in different stoichiometric ratios of metal elements to silicon elements formed in the resultant metal silicide layer, which may impact not only on the electrical performance of the devices, but also on the integration of the deposition of the conductive contact material subsequently formed thereon.

Therefore, there is a need for an improved pre-cleaning process for removing native oxides from the substrate surface prior to a metal silicide fabrication process.

SUMMARY OF THE INVENTION

Methods for precleaning native oxides or other contaminants from a surface of a substrate prior to forming a metal siliclide layer on the substrate are provided. In one embodiment, a method for removing native oxides from a substrate includes transferring a substrate having an oxide layer disposed thereon into a processing chamber, performing a pretreatment process on the substrate by supplying a pretreatment gas mixture into the processing chamber, performing an oxide removal process on the substrate by supplying a cleaning gas mixture into the processing chamber, wherein the cleaning gas mixture includes at least an ammonium gas and a nitrogen trifluoride, and performing a post treatment process on the cleaned substrate by supplying a post treatment gas mixture into the processing chamber.

In another embodiment, a method for removing native oxide from a substrate includes transferring a substrate having an oxide layer disposed on a gate electrode or a source or drain regions formed in the substrate into a processing chamber, performing a pretreatment process on the substrate by supplying a pretreatment gas mixture into the processing chamber, performing an oxide removal process on the substrate by supplying a cleaning gas mixture into the processing chamber, wherein the cleaning gas mixture includes at least an ammonium gas and a nitrogen trifluoride, and performing a post treatment process on the cleaned substrate by supplying a post treatment gas mixture into the processing chamber.

In yet another embodiment, a method for removing native oxide from a substrate includes transferring a substrate having an oxide layer disposed on a gate electrode or a source or drain regions formed in the substrate into a processing chamber, converting a surface of the oxide layer into a silicon hydrogen bond rich surface, performing an oxide removal process on the substrate by supplying a cleaning gas mixture into the processing chamber to remove the oxide layer from the substrate exposing the underlying gate electrode layer, wherein the cleaning gas mixture includes at least an ammonium gas and a nitrogen trifluoride, and converting the exposed gate electrode into a silicon hydrogen bond rich surface.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

As will be explained in greater detail below, a substrate having a surface disposed thereon is treated to remove native oxides or other contaminants prior to forming a metal silicide layer thereon. The term "substrate" as used herein refers to a layer of material that serves as a basis for subsequent processing operations and includes a surface to be cleaned for forming a metal silicide layer thereon. For example, the substrate can include one or more conductive metals, such as aluminum, copper, tungsten, or combinations thereof. The substrate can also include one or more nonconductive materials, such as silicon, silicon oxide, doped silicon, germanium, gallium arsenide, glass, and sapphire. The substrate can also include dielectric materials such as silicon dioxide, organosilicates, and carbon doped silicon oxides. Further, the substrate can include any other materials such as metal nitrides and metal alloys, depending on the application. In one or more embodiments, the substrate can form a gate structure including a gate dielectric layer and a gate electrode layer to facilitate connecting with an interconnect feature, such as a plug, via, contact, line, and wire, subsequently formed thereon.

Moreover, the substrate is not limited to any particular size or shape. The substrate can be a round wafer having a 200 mm diameter or a 300 mm diameter. The substrate can also be any polygonal, square, rectangular, curved or otherwise non-circular workpiece, such as a polygonal glass substrate used in the fabrication of flat panel displays.

Figure 1:
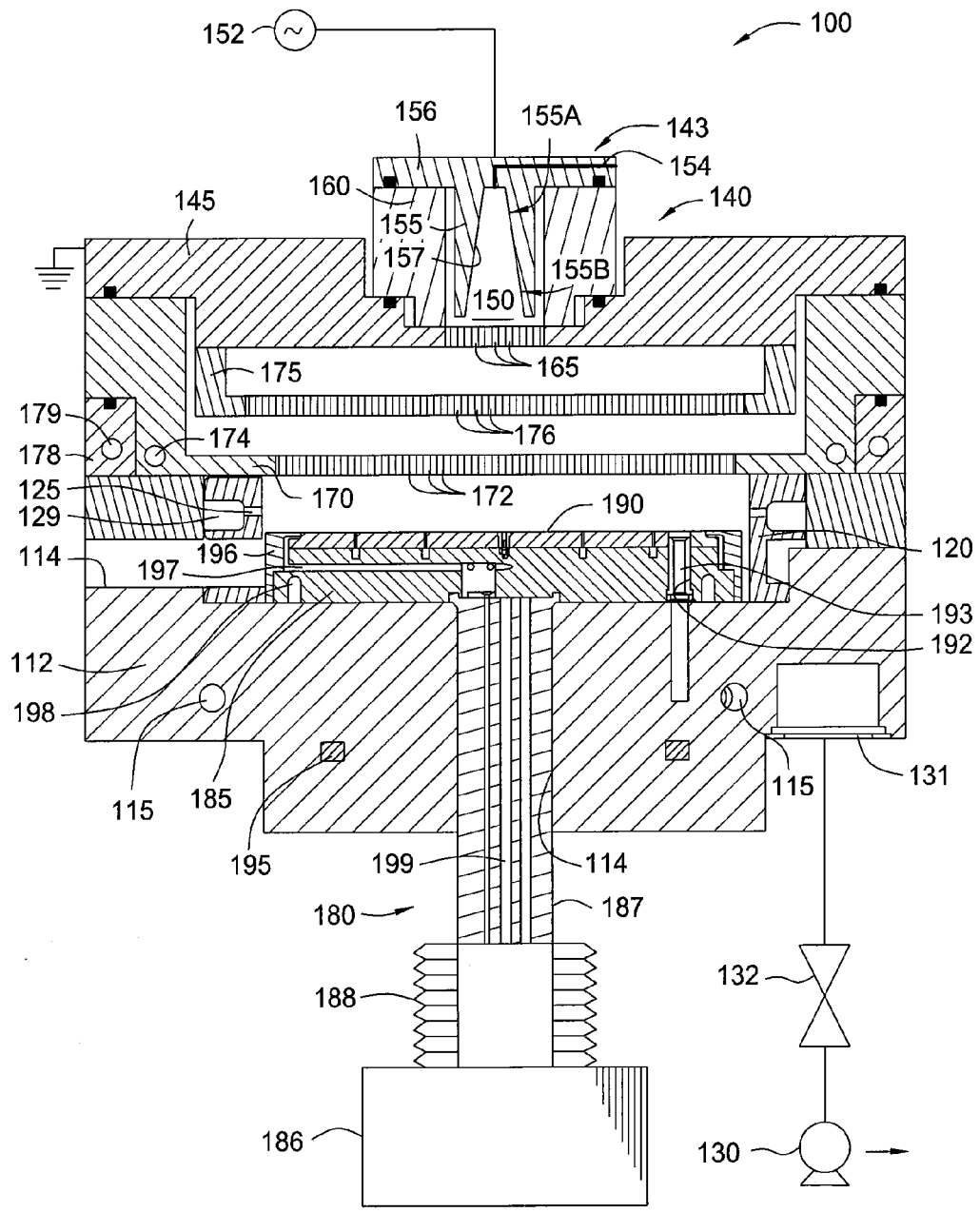
FIG. 1 is a cross section view of an illustrative processing chamber for removing native oxides from a contact surface as described.

FIG. 1 is a cross sectional view of an illustrative precleaning chamber 100 suitable for conducting a precleaning process as further described below. The chamber 100 may be configured to remove native oxides or other contaminants from a substrate surface prior to forming a metal silicide layer on the substrate. The chamber 100 is particularly useful for performing the plasma assisted dry etch process (i.e. the "preclean process"). The processing chamber 100 may be a Preclean PCII, PCXT or Siconi chambers which are available from Applied Materials, Santa Clara, Calif. It is noted that other vacuum chambers available from other manufactures may also be utilized to practice the present invention.

The processing chamber 100 provides both heating and cooling of a substrate surface without breaking vacuum. In one embodiment, the processing chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more embodiments, the chamber body 112 includes a channel 115 formed therein for flowing a heat transfer fluid therethrough. The heat transfer fluid can be a heating fluid or a coolant and is used to control the temperature of the chamber body 112 during processing and substrate transfer. The temperature of the chamber body 112 is important to prevent unwanted condensation of the gas or byproducts on the chamber walls. Exemplary heat transfer fluids include water, ethylene glycol, or a mixture thereof. An exemplary heat transfer fluid may also include nitrogen gas.

The chamber body 112 can further include a liner 120 that surrounds the support assembly 180. The liner 120 is removable for servicing and cleaning. The liner 120 can be made of a metal such as aluminum, a ceramic material, or any other process compatible material. The liner 120 can be bead blasted to increase surface roughness and/or surface area which increases the adhesion of any material deposited thereon, thereby preventing flaking of material which results in contaminants of the processing chamber 100. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed on the chamber body 112 and therefore, in fluid communication with the pumping channel 129 formed within the liner 120. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143,145.

In one or more embodiments, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof.

In one or more embodiments, the first electrode 143 has an expanding section 155 that houses the plasma cavity 150. In one or more embodiments, the expanding section 155 is an annular member that has an inner surface or diameter 157 that gradually increases from an upper portion 155A thereof to a lower portion 155B thereof. As such, the distance between the first electrode 143 and the second electrode 145 is variable. That varying distance helps control the formation and stability of the plasma generated within the plasma cavity 150.

In one or more embodiments, the expanding section 155 resembles an inverted cone or "funnel." In one or more embodiments, the inner surface 157 of the expanding section 155 gradually slopes from the upper portion 155A to the lower portion 155B of the expanding section 155. The slope or angle of the inner diameter 157 can vary depending on process requirements and/or process limitations. The length or height of the expanding section 155 can also vary depending on specific process requirements and/or limitations.

As mentioned above, the expanding section 155 of the first electrode 143 varies the vertical distance between the first electrode 143 and the second electrode 145 because of the gradually increasing inner surface 157 of the first electrode 143. That variable distance is directly related to the power level within the plasma cavity 150. Not wishing to be bound by theory, the variation in distance between the two electrodes 143, 145 allows the plasma to find the necessary power level to sustain itself within some portion of the plasma cavity 150 if not throughout the entire plasma cavity 150. The plasma within the plasma cavity 150 is therefore less dependent on pressure, allowing the plasma to be generated and sustained within a wider operating window. As such, a more repeatable and reliable plasma can be formed within the lid assembly 140.

The expanding section 155 is in fluid communication with the gas inlet 154 as described above. The first end of the one or more gas inlets 154 can open into the plasma cavity 150 at the upper most point of the inner diameter of the expanding section 155. Similarly, the first end of the one or more gas inlets 154 can open into the plasma cavity 150 at any height interval along the inner diameter 157 of the expanding section 155. Although not shown, two gas inlets 154 can be disposed at opposite sides of the expanding section 155 to create a swirling flow pattern or "vortex" flow into the expanding section 155 which helps mix the gases within the plasma cavity 150.

The lid assembly 140 can further include an isolator ring 160 to electrically isolate the first electrode 143 from the second electrode 145. The isolator ring 160 can be made from aluminum oxide or any other insulative, process compatible material. The isolator ring 160 surrounds or substantially surrounds at least the expanding section 155.

The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. As is known in the art, a hinge assembly (not shown) can be used to couple the lid rim 178 to the chamber body 112. The lid rim 178 can include an embedded channel or passage 179 for housing a heat transfer medium. The heat transfer medium can be used for heating, cooling, or both, depending on the process requirements.

In one or more embodiments, the second electrode or top plate 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. The apertures 172 can be sized and positioned about the distribution plate 170 to provide a controlled and even flow distribution to the chamber body 112 where the substrate to be processed is located. Furthermore, the apertures 172 prevent the gas(es) from impinging directly on the substrate surface by slowing and re-directing the velocity profile of the flowing gases, as well as evenly distributing the flow of gas to provide an even distribution of gas across the surface of the substrate.

In one or more embodiments, the distribution plate 170 includes one or more embedded channels or passages 174 for housing a heater or heating fluid to provide temperature control of the lid assembly 140. A resistive heating element (not shown) can be inserted within the passage 174 to heat the distribution plate 170. A thermocouple can be connected to the distribution plate 170 to regulate the temperature thereof. The thermocouple can be used in a feedback loop to control electric current applied to the heating element, as described above.

Alternatively, a heat transfer medium can be passed through the passage 174. The one or more passages 174 can contain a cooling medium, if needed, to better control temperature of the distribution plate 170 depending on the process requirements within the chamber body 112. Any heat transfer medium may be used, such as nitrogen, water, ethylene glycol, or mixtures thereof, for example.

In one or more embodiments, the lid assembly 140 can be heated using one or more heat lamps (not shown). Typically, the heat lamps are arranged about an upper surface of the distribution plate 170 to heat the components of the lid assembly 140 including the distribution plate 170 by radiation.

The blocker plate 175 is optional and would be disposed between the second electrode 145 and the distribution plate 170 when present. The blocker plate 175 is removably mounted to a lower surface of the second electrode 145. The blocker plate 175 should make good thermal and electrical contact with the second electrode 145. In one or more embodiments, the blocker plate 175 can be coupled to the second electrode 145 using a bolt or similar fastener. The blocker plate 175 can also be threaded or screwed onto an outer diameter of the second electrode 145.

The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution the distribution plate 170.

The support assembly 180 can include a support member 185 to support a substrate (not shown in this view) for processing within the chamber body 112. The support member 185 can be coupled to a lift mechanism 186 through a shaft 187 which extends through a centrally-located opening 114 formed in a bottom surface of the chamber body 112. The lift mechanism 186 can be flexibly sealed to the chamber body 112 by a bellows 188 that prevents vacuum leakage from around the shaft 187. The lift mechanism 186 allows the support member 185 to be moved vertically within the chamber body 112 between a process position and a lower transfer position. The transfer position is slightly below the opening of the slit valve 114 formed in a sidewall of the chamber body 112.

In one or more embodiments, the support member 185 has a flat, circular surface or a substantially flat, circular surface for supporting a substrate to be processed thereon. The support member 185 is constructed of aluminum. The support member 185 can include a removable top plate 190 made of some other material, such as silicon or ceramic material, for example, to reduce backside contaminants of the substrate.

In one or more embodiments, the substrate (not shown) may be secured to the support member 185 using a vacuum chuck. In one or more embodiments, the substrate (not shown) may be secured to the support member 185 using an electrostatic chuck. An electrostatic chuck typically includes at least a dielectric material that surrounds an electrode (not shown), which may be located on an upper surface of the support member 185 or formed as an integral part of the support member 185. The dielectric portion of the chuck electrically insulates the chuck electrode from the substrate and from the remainder of the support assembly 180.

The support member 185 can include one or more bores 192 formed therethrough to accommodate a lift pin 193. Each lift pin 193 is constructed of ceramic or ceramic-containing materials, and are used for substrate-handling and transport. The lift pin 193 is moveable within its respective bore 192 by engaging an annular lift ring 195 disposed within the chamber body 112. The lift ring 195 is movable such that the upper surface of the lift-pin 193 can be located above the substrate support surface of the support member 185 when the lift ring 195 is in an upper position. Conversely, the upper surface of the lift-pins 193 is located below the substrate support surface of the support member 185 when the lift ring 195 is in a lower position. Thus, part of each lift-pin 193 passes through its respective bore 192 in the support member 185 when the lift ring 195 moves from either the lower position to the upper position.

The support assembly 180 can further include an edge ring 196 disposed about the support member 185. In one or more embodiments, the edge ring 196 is an annular member that is adapted to cover an outer perimeter of the support member 185 and protect the support member 185 from deposition. The edge ring 196 can be positioned on or adjacent the support member 185 to form an annular purge gas channel between the outer diameter of support member 185 and the inner diameter of the edge ring 196. The annular purge gas channel can be in fluid communication with a purge gas conduit 197 formed through the support member 185 and the shaft 187. The purge gas conduit 197 is in fluid communication with a purge gas supply (not shown) to provide a purge gas to the purge gas channel. Any suitable purge gas such as nitrogen, argon, or helium, may be used alone or in combination. In operation, the purge gas flows through the conduit 197, into the purge gas channel, and about an edge of the substrate disposed on the support member 185. Accordingly, the purge gas working in cooperation with the edge ring 196 prevents deposition at the edge and/or backside of the substrate.

The temperature of the support assembly 180 can be controlled by a fluid circulated through a fluid channel 198 embedded in the body of the support member 185. In one or more embodiments, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 185 can further include an embedded thermocouple (not shown) for monitoring the temperature of the support surface of the support member 185. For example, a signal from the thermocouple may be used in a feedback loop to control the temperature or flowrate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within chamber 100.

In operation, the support member 185 can be elevated to a close proximity of the lid assembly 140 to control the temperature of the substrate being processed. As such, the substrate can be heated via radiation emitted from the distribution plate 170. Alternatively, the substrate can be lifted off the support member 185 to close proximity of the heated lid assembly 140 using the lift pins 193 activated by the lift ring 195.

A system controller (not shown) can be used to regulate the operations of the processing chamber 100. The system controller can operate under the control of a computer program stored on a memory of a computer. The computer program may include instructions that enable the preclean process described below to be performed in the processing chamber 100. For example, the computer program can dictate the process sequencing and timing, mixture of gases, chamber pressures, RF power levels, susceptor positioning, slit valve opening and closing, wafer cooling and other parameters of a particular process.

Figure 2:
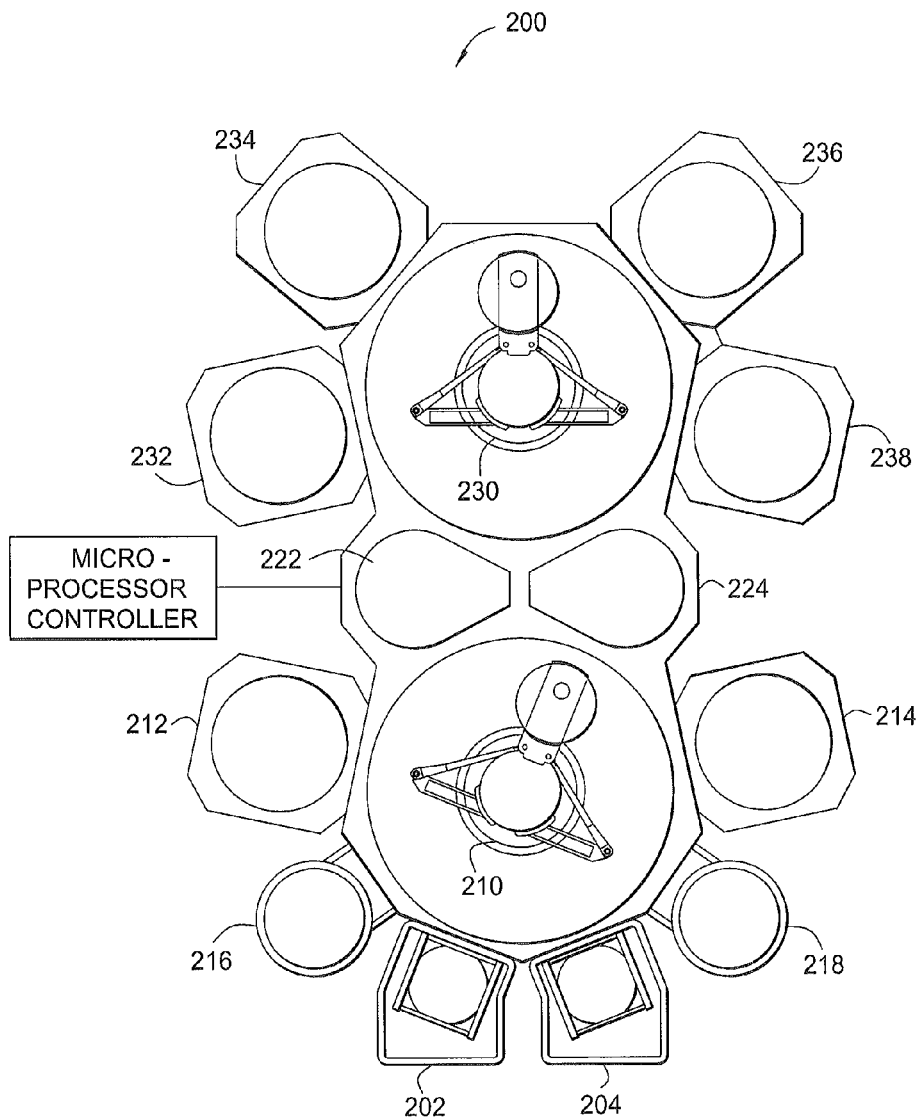
FIG. 2 is a schematic top-view diagram of an illustrative multi-chamber processing system.

FIG. 2 is a schematic top-view diagram of an illustrative multi-chamber processing system 200 that can be adapted to perform processes as disclosed herein having the processing chamber 100 coupled thereto. The system 200 can include one or more load lock chambers 202, 204 for transferring substrates into and out of the system 200. Typically, since the system 200 is under vacuum, the load lock chambers 202, 204 can "pump down" the substrates introduced into the system 200. A first robot 210 can transfer the substrates between the load lock chambers 202, 204, and a first set of one or more substrate processing chambers 212, 214, 216, 100 (four are shown). Each processing chamber 212, 214, 216, 100 is configured to perform at least one of substrate processing operations, such as cyclical layer deposition (CLD), atomic layer deposition (ALD), chemical vapor deposition (CVD), physical vapor deposition (PVD), etch, degas, orientation and other substrate processes. The position of the processing chamber 100 utilized to perform the preclean process relative to the other chambers 212, 214, 216 us for illustration, and the position of the processing chamber 100 may be optionally be switched with any one of the processing chambers 212, 214, 216 if desired.

The first robot 210 can also transfer substrates to/from one or more transfer chambers 222, 224. The transfer chambers 222, 224 can be used to maintain ultrahigh vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 214, 216, 100, the processing chambers 232, 234, 236, 238 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 212, 214, 216, 100, 232, 234, 236, 238 can be removed from the system 200 if not necessary for a particular process to be performed by the system 200.

After the preclean process is formed in the processing chamber 100, the substrate may further be transferred to any of the processing chambers 212, 214, 216, 232, 234, 236, 238 disposed in the system 200 to perform other process, such as a metal layer deposition or metal silicide layer fabrication process.

Figure 3:
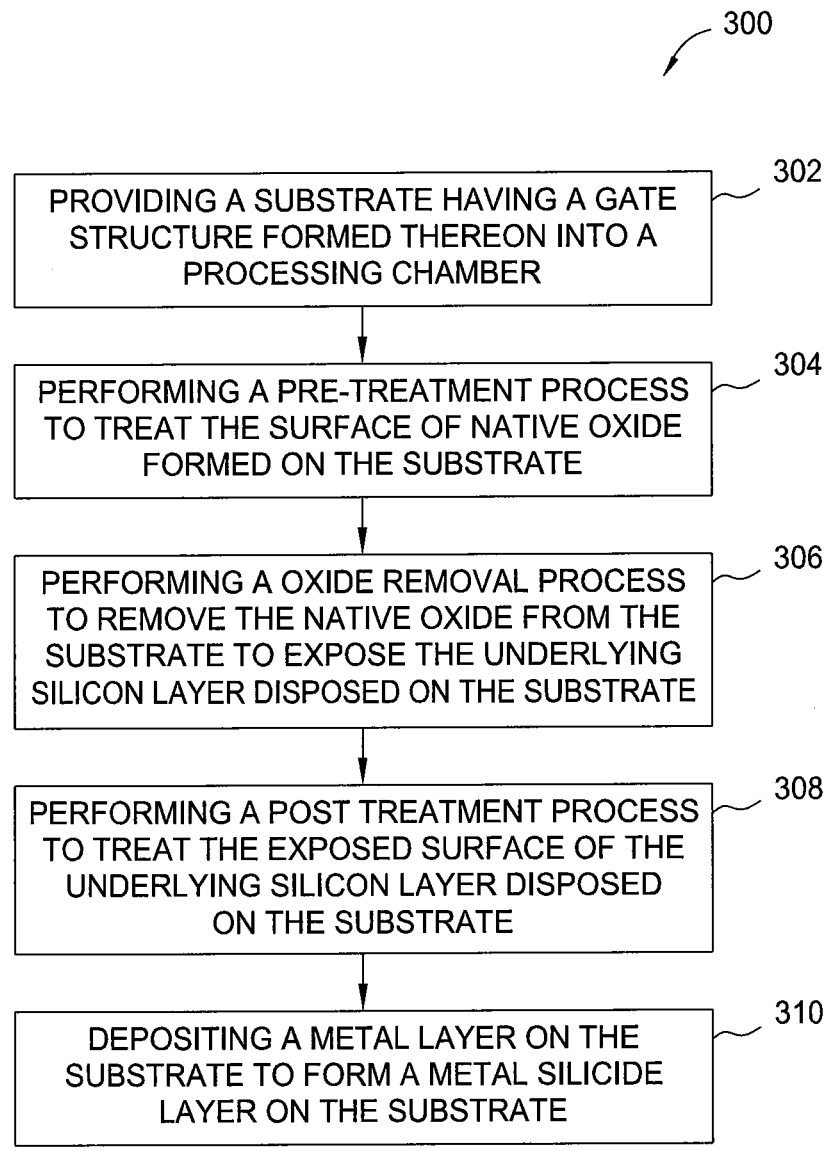
FIG. 3 depicts a flow diagram for pre-cleaning a semiconductor device formed on a substrate prior to a metal salicidation process in accordance with one embodiment of the present invention.

FIG. 3 illustrates a process sequence 300 used to form a semiconductor device structure on a substrate. The sequence described in FIG. 3 corresponds to the fabrication stages depicted in FIGS. 4A-4E, which is discussed below. FIGS. 4A-4E illustrate schematic cross-sectional views of a substrate 402 having a gate structure 450 formed thereon during different stages of fabricating a metal silicide layer on the gate structure illustrated by the processing sequence 300.

Figure 4A:
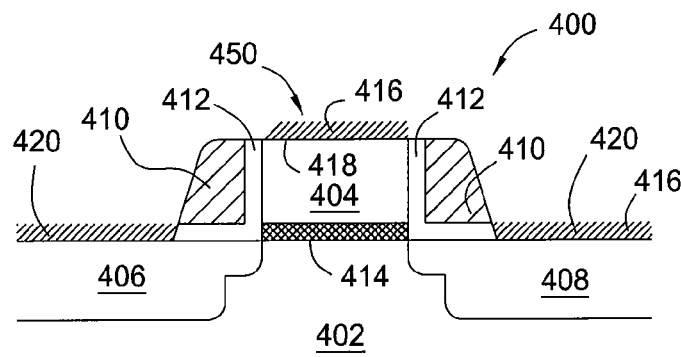
FIGS. 4A-4E depict cross-sectional views of a semiconductor device during the formation of a localized contact structure in accordance with one embodiment of the present invention.

The process sequence 300 starts at step 302 by providing a substrate, such as the substrate 402 depicted in FIG. 4A, into the processing chamber, such as the processing chamber 100 depicted in FIG. 1, or other suitable processing chamber. The substrate 402 shown in FIG. 4A includes a gate structure 450 formed on the substrate 402. Source and drain regions 406, 408 are formed in the substrate 402 adjacent to the gate structure 450. The gate structure 450 includes a gate electrode 404 disposed on a gate dielectric 414. A spacer liner 412 may be formed adjacent to the gate structure 450 surrounded by a spacer dielectric 410. In one embodiment, the substrate 402 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 402 may have various dimensions, such as 200 mm or 300 mm diameter wafers, as well as, rectangular or square panels. Unless otherwise noted, embodiments and examples described herein are conducted on substrates with a 200 mm diameter or a 300 mm diameter.

In one embodiment, the dielectric layer 414 may be a dielectric material selected from a group consisting of an oxide layer, a nitride layer, titanium nitride layer, a composite of oxide and nitride layer, at least one or more oxide layers sandwiching a nitride layer, and combinations thereof, among others. The gate electrode layer 404 may be a polysilicon layer, a doped silicon layer, or other suitable silicon containing material. In yet another embodiment, the gate electrode layer 404 may be a composite film including a polysilicon layer disposed on a metal material. The source 406 and drain region 408 may be manufactured by doped polysilicon, such as n-type or p-type doped monocrystalline silicon. The space liner 412 and the spacer dielectric 410 may also be fabricated from a dielectric material selected from a group consisting of an oxide layer, a nitride layer, metal nitride layer, a composite of oxide and nitride layer, or among others.

During transfer, the substrate 402 may be subjected to oxidative conditions which may adversely increase likelihood of growing native oxides 416 and be the source of other contaminants formed on the surfaces 418, 420 of the gate structure 450 and the source 406 and drain 408 region formed on the substrate 402. As the materials used to fabricate the gate structure 450 and the source 406 and drain 408 are mostly silicon containing layer, native oxide 416 formed on the surfaces 418, 420 are often silicon oxide layers or silicon oxide containing materials. Native oxide 416 formed on the gate structure 450 and the source 406 and drain region 408 of the substrate 402 may increase the electrical resistance of the semiconducting material, and adversely affect the electrical conductivity of the subsequently metal silicide layer as formed. Therefore, it is desirable to remove the native oxide prior to forming the metal silicide layer or other metal conductors for interconnecting active electronic devices.

At step 304, a pretreatment process is performed to treat the substrate surfaces 418, 420 to remove native oxides 416 or other source of contaminants. Removal of native oxides 416 or other source of contaminants from the substrate 402 may provide a low contact resistance surface to form a good contact surface to the metal silicide layer. The pretreatment process performed at step 304 includes supplying a pretreatment gas mixture into the chamber 100. A plasma is then formed from the pretreatment gas mixture to plasma treat the surfaces 420, 418 of the substrate 402 to activate the native oxide 416 or other source of contaminants into an excited state, which may then easily react with cleaning gases subsequently supplied into the processing chamber 100, forming volatile gas byproducts which readily pumps out of the processing chamber 100.

In one embodiment, the pretreatment gas mixture includes at least a hydrogen containing gas and an inert gas. It is believed that the inert gas supplied in the pretreatment gas mixture may assist increasing the lifetime of the ions in the plasma formed from the pretreatment gas mixture. Increased lifetime of the ions may assist reacting with and activating the native oxide 416 on the substrate 402 more thoroughly, thereby enhancing the removal of the activated native oxide 416 from the substrate 402 during the subsequent cleaning process. In addition, the hydrogen containing gas supplied in the pretreatment gas mixture may react with the silicon atoms contained in the native oxide 416, thereby forming weak and dangling bond of Si—H or Si—OH bond on the native oxide surface. Native oxide 416 with Si—H or Si—OH bond terminals may easily to be absorbed by other etchants subsequently supplied to the processing chamber 100, thereby assisting ease of removal of the native oxide 416 from the substrate surface.

In one embodiment, the hydrogen containing gas supplied into the processing chamber 100 includes at least one of $H_2$, $H_2O$, and the like. The inert gas supplied into the processing chamber 100 includes at least one of Ar, He, Kr, and the like. In an exemplary embodiment, the hydrogen containing gas supplied in the processing chamber 100 to perform the pretreatment process is $H_2$ gas and the inert gas is He.

During the plasma pretreatment process, several process parameters may be regulated to control the pretreatment process. In one exemplary embodiment, a process pressure in the processing chamber 100 is regulated between about 100 mTorr to about 5000 mTorr, such as between about 300 mTorr and about 3000 mTorr, for example, at about 2000 mTorr. A RF source power may be applied to maintain a plasma in the pretreatment gas mixture. For example, a power of about 200 Watts to about 600 Watts may be applied to maintain a plasma inside the processing chamber 100. The hydrogen containing gas supplied in the pretreatment gas mixture may be flowed into the chamber at a rate between about 200 sccm to about 5000 sccm and the inert gas supplied in the pretreatment gas mixture may be flowed at a rate between about 200 sccm and about 5000 sccm. A substrate temperature is maintained between about 25 degrees Celsius to about 300 degrees Celsius.

In one embodiments, the substrate is subjected to perform the pretreatment process for between about 5 seconds to about 5 minutes, depending on the operating temperature, pressure and flow rate of the gas. For example, the substrate can be exposed for about 30 seconds to about 90 seconds. In an exemplary embodiment, the substrate is exposed for about 90 seconds or less.

Figure 4B:
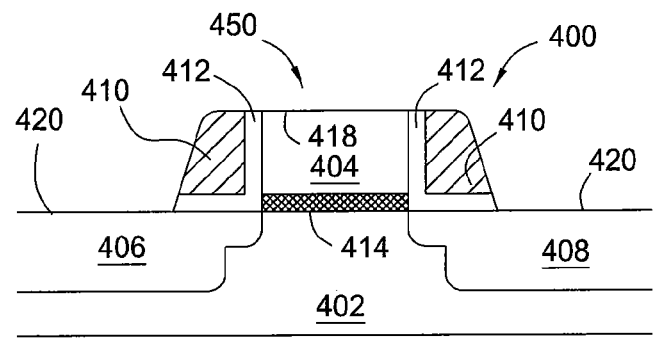

At step 306, an oxide removal process is performed to remove the treated native oxide 416 from the surfaces 420, 418 from the substrate 402, as shown in FIG. 4B. The oxide removal process is performed by supplying a cleaning gas mixture into the processing chamber 100 to form a plasma from the cleaning gas mixture for removing the native oxide 416. As the native oxide 416 has been treated to have weak and dangling bonds with Si—H or Si—OH bond terminals on the surface, during the oxide removal process, the aggressive etchants from the cleaning gas mixture may easily attack the week and dangling bonds with Si—H or Si—OH bond terminals and efficiently remove the native oxide 416 from the substrate surface.

In one embodiment, the cleaning gas mixture used to remove native oxides 416 is a mixture of ammonia ($NH_3$) and nitrogen trifluoride ($NF_3$) gases. The amount of each gas introduced into the processing chamber may be varied and adjusted to accommodate, for example, the thickness of the native oxide layer to be removed, the geometry of the substrate being cleaned, the volume capacity of the plasma, the volume capacity of the chamber body, as well as the capabilities of the vacuum system coupled to the chamber body.

In one or more embodiments, the gases added to provide a cleaning gas mixture having at least a 1:1 molar ratio of ammonia ($NH_3$) to nitrogen trifluoride ($NF_3$). In one or more embodiments, the molar ratio of the cleaning gas mixture is at least about 3:1 (ammonia to nitrogen trifluoride). The gases are introduced in the chamber 100 at a molar ratio of from about 5:1 (ammonia to nitrogen trifluoride) to about 30:1. In yet another embodiment, the molar ratio of the gas mixture is of from about 5:1 (ammonia to nitrogen trifluoride) to about 10:1. The molar ratio of the cleaning gas mixture can also fall between about 10:1 (ammonia to nitrogen trifluoride) and about 20:1.

A purge gas or carrier gas can also be added to the cleaning gas mixture. Any suitable purge/carrier gas can be used, such as argon, helium, hydrogen, nitrogen, or mixtures thereof. The overall cleaning gas mixture is from about 0.05% to about 20% by volume of ammonia and nitrogen trifluoride. The remainder of the cleaning gas mixture may be the purge/carrier gas. In one embodiment, the purge/carrier gas is first introduced into the chamber body 112 before the reactive gases (i.e., $NF_3$ and $NH_3$) to stabilize the pressure within the chamber body 112.

The operating pressure within the chamber can be variable. The pressure is maintained between about 1 Torr and about 10 Torr. A RF source power may be applied to maintain a plasma in the cleaning gas mixture. For example, a power of about 15 Watts to about 100 Watts may be applied to maintain a plasma inside the processing chamber 100. The frequency at which the power is applied around 350 kHz. The frequency can range from about 50 kHz to about 350 kHz.

The plasma energy dissociates the ammonia and nitrogen trifluoride gases into reactive species, e.g. fluorine radicals and/or hydrogen radicals, that combine to form a highly reactive ammonia fluoride ($NH_4F$) compound and/or ammonium hydrogen fluoride ($NH_4F.HF$) in the gas phase. These molecules are then delivered from the plasma location to the substrate surface to be cleaned. A purge/carrier gas can be used to facilitate the delivery of the reactive species to the substrate.

After the native oxide removal process performed at step 306, the underlying surfaces 418, 420 of the gate electrode 404 and the source 406 and drain region 408 are then exposed. As discussed above, as the gate electrode 404 and the source 406 and drain region 408 are often fabricated from silicon containing materials, the source of silicon from the silicon containing materials are then exposed and ready to have a metal layer disposed thereon to form a desired metal silicide layer.

In one embodiments, the substrate is subjected to perform the native oxide removal process for between about 5 seconds to about 5 minutes, depending on the operating temperature, pressure and flow rate of the gas. For example, the substrate can be exposed for about 5 seconds to about 90 seconds. In an exemplary embodiment, the substrate is exposed for about 60 seconds or less.

Figure 4C:
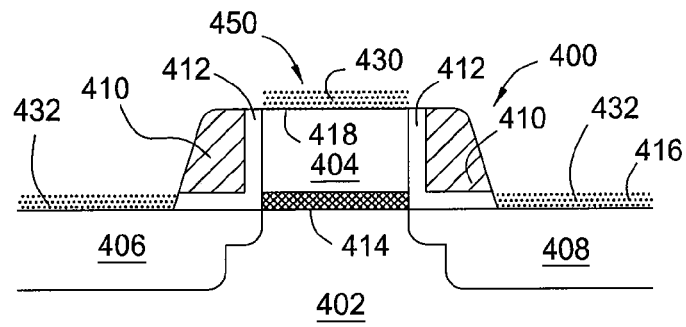

At step 308, prior to formation of the metal silicide layer, a post treatment process may be performed on the surfaces 418, 420 of exposed the gate electrode 404 and the source 406 and drain region 408. As discussed above, as the surfaces of the gate electrode 404 and the source 406 and drain region 408 are often fabricated from silicon containing materials, the post treatment process performed on the surfaces to alter the surface properties of the silicon containing materials into a metal atomic absorptive surface 430, as shown in FIG. 4C, so as to promote nucleation capability of the metal silicide layer subsequently formed thereon.

As discussed, as the oxide removal process performed at step 306 uses $NF_3/NH_3$ as the cleaning gas mixture, the fluorine (F) ions and the nitrogen ions (N) remained on the substrate surface may form silicon fluorine (Si—F) or other dangling bonds at the interface, which may adversely affect the adhesion of the metal layer subsequently formed thereon. Accordingly, the post treatment process at step 308 is performed to remove the cleaning residuals, such as the silicon fluorine (Si—F) or other dangling bonds at the interface, and alter the surface properties to have Si—H or Si—OH bond terminals, which may provide a good adherence for the metallic atoms to nucleate and adhere thereon. Furthermore, the post treatment process as performed at step 308 may also help remove and blow off surface particles, cleaning byproducts, or other surface impurities from the substrate surface, thereby providing a cleaning surface to have the metal layer deposited thereon with minimum contact resistance.

In one embodiment, the post treatment gas mixture as performed at step 308 may be similar to the pretreatment gas mixture selected to perform at step 304. The post treatment gas mixture includes at least a hydrogen containing gas and an inert gas. It is believed that hydrogen containing gas supplied in the post treatment gas mixture may react with the silicon fluorine bonds formed on the substrate surface atoms contained in the native oxide 416, thereby forming volatile gas byproduct, such as HF containing ions or radicals, which readily pumps out of the chamber 100. Furthermore, it is also believed that the hydrogen containing gas supplied in the post treatment gas mixture may react with the silicon atoms from the substrate surface, forming Si—H or Si—OH bond on the substrate surface, which may assist absorbing or adhere metallic atoms configured to form the metal layer, thereby increasing the nucleation capability for forming the metal layer during the subsequent metal silicidation process.

In one embodiment, the hydrogen containing gas be supplied into the processing chamber 100 includes at least one of $H_2$, $H_2O$, and the like. The inert gas selected to be supplied into the processing chamber 100 includes at least one of Ar, He, Kr, and the like. In an exemplary embodiment, the hydrogen containing gas supplied in the processing chamber 100 to perform the post treatment process is $H_2$ gas and the inert gas is He.

During the post treatment process, several process parameters may be regulated to control the post treatment process. In one exemplary embodiment, a process pressure in the processing chamber 100 is regulated between about 100 mTorr to about 5000 mTorr, such as between about 300 mTorr and about 3000 mTorr, for example, at about 2000 mTorr. A RF source power may be applied to maintain a plasma in the post treatment gas mixture. For example, a power of about 200 Watts to about 800 Watts may be applied to maintain a plasma inside the processing chamber 100. The hydrogen containing gas supplied in the post treatment gas mixture may be flowed into the chamber at a rate between about 200 sccm to about 5000 sccm and the inert gas supplied in the post treatment gas mixture may be flowed at a rate between about 200 sccm and about 5000 sccm. A substrate temperature is maintained between about 25 degrees Celsius to about 300 degrees Celsius.

In one embodiments, the substrate is subjected to perform the post treatment process for between about 5 seconds to about 5 minutes, depending on the operating temperature, pressure and flow rate of the gas. For example, the substrate can be exposed for about 30 seconds to about 90 seconds. In another embodiment, the substrate is exposed for about 90 seconds or less.

Figure 4D:
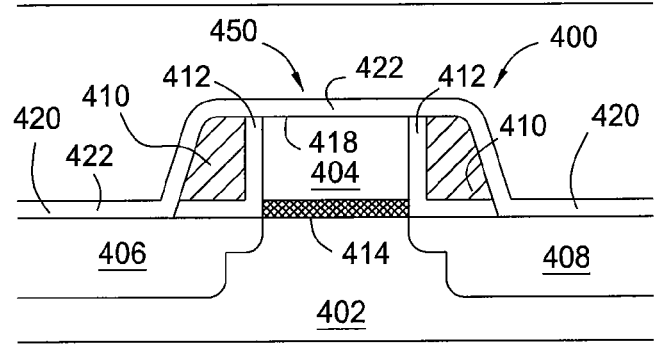
Figure 4E:
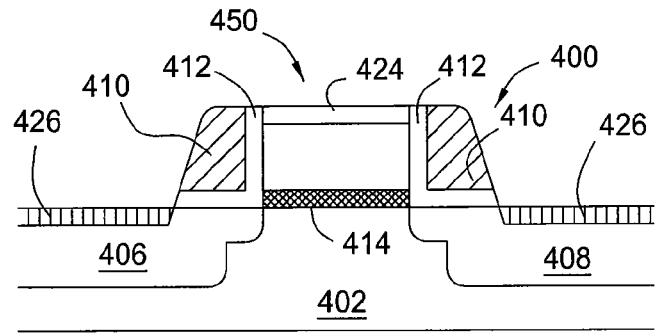

At step 310, a metal layer 422 is formed over the substrate 402, as shown in FIG. 4D. The metal layer 422 formed on the substrate 402 may later be annealed to react with the underlying materials, such as the gate electrode 404 formed in the gate structure 450 and the source 406 and drain region 408. As the gate electrode 404 and the source 406 and drain region 408 are made from silicon containing materials, the silicon atoms from silicon containing materials may react with the metallic atoms from the metal layer 422, forming a metal silicide layer 424, 426, as shown in FIG. 4E, during the subsequent thermal processing. While some portion of the metal layer 422 is turned into the metal silicide layer 424, 426 on the gate structure 450 and the source 406 and drain 408 region after the thermal processing, some other portions of the metal layer 422 may remain unchanged (e.g., metal layer 422 formed on the area above the space liner 412 and the spacer dielectric 410) due to the material difference formed in the underlying materials. Therefore, a etching process (e.g., a dry or wet selective etching) may be performed to remove the remaining metal layer 422 from the substrate 402 such that only the metal silicide layer 424, 426 remains on the substrate 402.

In one embodiment, the metal layer 422 may be a tungsten, titanium, cobalt, nickel, tantalum, palladium, platinum or combinations thereof. Each layer can be formed using any one or more depositions techniques, such as atomic layer deposition (ALD), cyclical layer deposition (CLD), physical vapor deposition (PVD), chemical vapor deposition (CVD), plasma enhanced chemical vapor deposition (PECVD), evaporation, for example. The metal silicide layer 424, 426 formed after the thermal process may be tungsten silicide, titanium silicide, cobalt silicide, nickel silicide, tantalum silicide, palladium silicide, platinum silicide or combinations thereof.

After the metal silicide layer 424, 426 is formed on the substrate 402, a contact structure may be then followed to be formed on the substrate to continue forming the interconnection structure on the substrate 402. The term "contact surface" as used herein refers to a layer of material that includes a metal silicide that can form part of a gate electrode.

Thus, a method and an apparatus for removing native oxide from a substrate prior to forming a metal silicide layer are provided. The method and apparatus advantageously removing the native oxides from the substrate by utilizing a three-step cleaning process, a pretreatment process, a cleaning process and a post treatment process. The three step cleaning process can efficiently remove native oxides from the substrate surface while providing a good nucleation surface for the metal silicide layer subsequently formed thereon with good adhesion and minimum contact resistant, thereby improving the overall electrical device performance.

While the foregoing is directed to embodiments of the present invention, other and further embodiments of the invention can be devised without departing from the basic scope thereof, and the scope thereof is determined by the claims that follow.

The invention claimed is:

1. A method for removing native oxides from a substrate, comprising:
transferring a substrate having an oxide layer disposed thereon into a processing chamber;
performing a multiple step cleaning process in the processing chamber to remove the oxide layer, wherein the multiple step cleaning process comprises:
performing a pretreatment process on the substrate by supplying a pretreatment gas mixture into the processing chamber to form a plasma during the pretreatment process to activate the oxide layer on the substrate;
performing an oxide removal process on the substrate by supplying a cleaning gas mixture into the processing chamber, wherein the cleaning gas mixture includes at least an ammonium gas and a nitrogen trifluoride to remove the activated oxide layer from the substrate; and
performing a post treatment process on the cleaned substrate by supplying a post treatment gas mixture into the processing chamber to form a plasma during the post treatment process after removal of the oxide layer.

2. The method of claim 1, wherein the pretreatment gas mixture includes at least a hydrogen containing gas and an inert gas.

3. The method of claim 2, wherein the hydrogen containing gas used in the pretreatment gas mixture include at least one of $H_2$ and $H_2O$.

4. The method of claim 2, wherein the inert gas used in the pretreatment gas mixture includes at least one of Ar, He, and Kr.

5. The method of claim 1, wherein the post treatment gas mixture includes at least a hydrogen containing gas and an inert gas.

6. The method of claim 5, wherein the hydrogen containing gas used in the post treatment gas mixture include at least one of $H_2$ and $H_2O$.

7. The method of claim 5, wherein the inert gas used in the post treatment gas mixture includes at least one of Ar, He, and Kr.

8. The method of claim 1, wherein the substrate has a gate electrode disposed and source and drain regions formed thereon.

9. The method of claim 1, wherein the oxide layer is formed on the gate electrode layer or the source and drain region.

10. The method of claim 1, wherein performing the pretreatment process comprises:
forming a hydrogen bond to the surface of the oxide layer.

11. The method of claim 1, wherein performing the post treatment process further comprises:
removing fluorine residual generated from the cleaning process from the substrate.

12. The method of claim 1, further comprising:
forming a metal silicide layer on the post treated substrate in the processing chamber.

13. A method for removing native oxide from a substrate, comprising:
transferring a substrate having an oxide layer disposed on a gate electrode or a source or drain regions formed in the substrate into a processing chamber;
performing a multiple step cleaning process in the processing chamber to remove the oxide layer, wherein the multiple step cleaning process comprises:
performing a pretreatment process on the substrate by supplying a pretreatment gas mixture into the processing chamber to form a plasma during the pretreatment process to activate the oxide layer on the substrate;
performing an oxide removal process on the substrate by supplying a cleaning gas mixture into the processing chamber to remove the activated oxide layer from the substrate, wherein the cleaning gas mixture includes at least an ammonium gas and a nitrogen trifluoride; and
performing a post treatment process on the cleaned substrate by supplying a post treatment gas mixture into the processing chamber to form a plasma during the post treatment process.

14. The method of claim 13, further comprising:
forming a metal silicide layer on the post treated substrate.

15. The method of claim 13, wherein the pretreatment gas mixture or the post treatment gas mixture includes at least a hydrogen containing gas and an inert gas.

16. The method of claim 15, wherein the hydrogen containing gas used in the pretreatment gas mixture or the post treatment gas mixture include at least one of $H_2$ and $H_2O$.

17. The method of claim 15, wherein the inert gas used in the pretreatment gas mixture or post treatment gas mixture includes at least one of Ar, He, and Kr.

18. A method for removing native oxide from a substrate, comprising:
- transferring a substrate having an oxide layer disposed on a gate electrode or a source or drain regions formed in the substrate into a processing chamber;
- performing a multiple step cleaning process in the processing chamber to remove the oxide layer, wherein the multiple step cleaning process comprises:
  - converting a surface of the oxide layer into a silicon hydrogen bond rich surface by a plasma generated in the processing chamber to activate the oxide layer on the substrate;
  - performing an oxide removal process on the substrate by supplying a cleaning gas mixture into the processing chamber to remove the activated oxide layer from the substrate exposing the underlying gate electrode layer, wherein the cleaning gas mixture includes at least an ammonium gas and a nitrogen trifluoride; and
  - converting the exposed gate electrode into a silicon hydrogen bond rich surface by a plasma generated in the processing chamber.

19. The method of claim 18, wherein converting the surface of the oxide layer further comprises:
- supplying a hydrogen containing gas and an inert gas into the chamber; and
- forming the plasma from the hydrogen containing gas and the inert gas.

20. The method of claim 18, wherein converting the exposed gate electrode comprises:
- supplying a post treatment gas mixture to treat the exposed gate electrode, wherein the post treatment gas mixture includes at least a hydrogen containing gas and an inert gas; and
- forming the plasma from the post treatment gas mixture.

* * * * *

UNITED STATES PATENT AND TRADEMARK OFFICE
CERTIFICATE OF CORRECTION

PATENT NO. : 8,912,096 B2
APPLICATION NO. : 13/097016
DATED : December 16, 2014
INVENTOR(S) : Zheng et al.

Page 1 of 1

It is certified that error appears in the above-identified patent and that said Letters Patent is hereby corrected as shown below:

In the Specification,

In Summary of the Invention:

Column 1, Line 59, please delete "siliclide" and insert -- silicide -- therefor;

In Detailed Description:

Column 10, Line 29, please delete "embodiments" and insert -- embodiment -- therefor;

Column 10, Line 67, please delete "of";

Column 11, Line 40, please delete "embodiments" and insert -- embodiment -- therefor;

Column 12, Line 50, please delete "embodiments" and insert -- embodiment -- therefor.

Signed and Sealed this
Ninth Day of June, 2015

Michelle K. Lee
*Director of the United States Patent and Trademark Office*